United States Patent
Inaba et al.

(10) Patent No.: US 12,435,427 B2
(45) Date of Patent: Oct. 7, 2025

(54) SUBSTRATE PROCESSING METHOD AND STORAGE MEDIUM

(71) Applicant: Tokyo Electron Limited, Tokyo (JP)

(72) Inventors: Shogo Inaba, Koshi (JP); Masatoshi Kawakita, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/239,825

(22) Filed: Aug. 30, 2023

(65) Prior Publication Data

US 2023/0407482 A1    Dec. 21, 2023

Related U.S. Application Data

(62) Division of application No. 17/464,926, filed on Sep. 2, 2021, now Pat. No. 11,773,492.

(30) Foreign Application Priority Data

Sep. 4, 2020    (JP) ................. 2020-148900

(51) Int. Cl.
     *B05D 1/00*      (2006.01)
     *B05C 5/02*      (2006.01)
     (Continued)

(52) U.S. Cl.
     CPC ........ *C23C 18/2033* (2013.01); *B05C 5/0204* (2013.01); *B05C 5/0216* (2013.01); *C23C 18/1692* (2013.01); *C23C 18/2046* (2013.01)

(58) Field of Classification Search
     CPC ............ C23C 18/2033; C23C 18/1692; C23C 18/2046; B05C 5/0204; B05C 5/0216;
     (Continued)

(56) References Cited

U.S. PATENT DOCUMENTS 8,069,816 B2    12/2011    Yamamoto et al.
2008/0124489 A1    5/2008    Yamamoto et al.
(Continued)

FOREIGN PATENT DOCUMENTS

JP      63-169727 A    7/1988
JP      H63169727 A    1/1990
(Continued)

OTHER PUBLICATIONS

JP-H0645302-A, machine translation, originally published 1994, p. 1-7 (Year: 1994).*
English Translation 2017191853A (Year: 2017).

*Primary Examiner* — Gordon Baldwin
*Assistant Examiner* — Christina D McClure
(74) *Attorney, Agent, or Firm* — Nath, Goldberg & Meyer; Jerald L. Meyer; Tanya E. Harkins

(57) ABSTRACT

A substrate processing apparatus for forming a coating film on a peripheral edge portion including a peripheral edge of a front surface and a side surface of a substrate, includes: a substrate holder for rotatably holding the substrate; a first chemical liquid supplier for supplying a first chemical liquid onto the peripheral edge including a rear surface of the substrate; a partial removing part for removing the first chemical liquid adhering to at least a portion of the front and side surfaces; a second chemical liquid supplier for supplying a second chemical liquid for forming the coating film onto the front and side surfaces; a first chemical liquid removing part for removing the first chemical liquid remaining on the substrate to which the second chemical liquid adheres; and a controller for controlling the parts described above.

7 Claims, 9 Drawing Sheets

(51) Int. Cl.
*C23C 18/16* (2006.01)
*C23C 18/20* (2006.01)

(58) Field of Classification Search
CPC ........ G03F 7/162; G03F 7/168; G03F 7/3021;
G03F 7/42; B05D 3/107; B05D 1/005;
B05D 1/36; H01L 21/6708; H01L
21/6715; H01L 21/68714; H01L 21/0273;
B05B 13/0228
See application file for complete search history.

(56) References Cited

U.S. PATENT DOCUMENTS

| | | | |
|---|---|---|---|
| 2010/0075054 A1 | 3/2010 | Kaneyama et al. | |
| 2011/0200321 A1* | 8/2011 | Takiguchi | G03F 7/3021 |
| | | | 396/577 |
| 2014/0038423 A1* | 2/2014 | Iwao | H01L 21/6708 |
| | | | 438/758 |
| 2018/0012754 A1* | 1/2018 | Nanba | H01L 21/32134 |
| 2018/0088466 A1* | 3/2018 | Kawakami | B05D 1/322 |
| 2018/0284616 A1* | 10/2018 | Kawakami | G03F 7/422 |

FOREIGN PATENT DOCUMENTS

| | | | |
|---|---|---|---|
| JP | H0645302 A * | 2/1994 | |
| JP | 2006332185 A | 12/2006 | |
| JP | 2011238950 A | 11/2011 | |
| JP | 2013-062436 A | 4/2013 | |
| JP | 2017191853 A | 10/2017 | |
| JP | 2019186405 A | 10/2019 | |

* cited by examiner

SUBSTRATE PROCESSING METHOD AND STORAGE MEDIUM

CROSS-REFERENCE TO RELATED APPLICATION

This is a Divisional Application of U.S. patent application Ser. No. 17/464,926, filed Sep. 2, 2021, an application claiming benefit from Japan Application No. 2020-148900, filed Sep. 4, 2020, the content of each of which is hereby incorporated by reference in its entirety.

TECHNICAL FIELD

The present disclosure relates to a substrate processing apparatus, a substrate processing method, and a non-transitory computer-readable storage medium.

BACKGROUND

Patent document 1 discloses a technique of applying a coating liquid on a peripheral edge portion of a substrate so as to form a ring-shaped coating film.

PRIOR ART DOCUMENT

Patent Document

Patent Document 1: Japanese Laid-Open Patent Publication No. 2013-062436

SUMMARY

According to an embodiment of the present disclosure, a substrate processing apparatus for forming a coating film on a peripheral edge portion including a peripheral edge of a front surface of a substrate and a side surface of the substrate, including: a substrate holder configured to rotatably hold the substrate; a first chemical liquid supplier configured to supply a first chemical liquid onto the peripheral edge of the substrate including a rear surface of the substrate; a partial removing part configured to remove, among the first chemical liquid supplied onto the substrate, the first chemical liquid adhering to at least a portion of the front surface and the side surface of the substrate; a second chemical liquid supplier configured to supply a second chemical liquid for forming the coating film onto the front surface and the side surface of the substrate; a first chemical liquid removing part configured to remove the first chemical liquid remaining on the substrate to which the second chemical liquid adheres; and a controller configured to control the substrate holder, the first chemical liquid supplier, the partial removing part, the second chemical liquid supplier, and the first chemical liquid removing part.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

Figure 1:
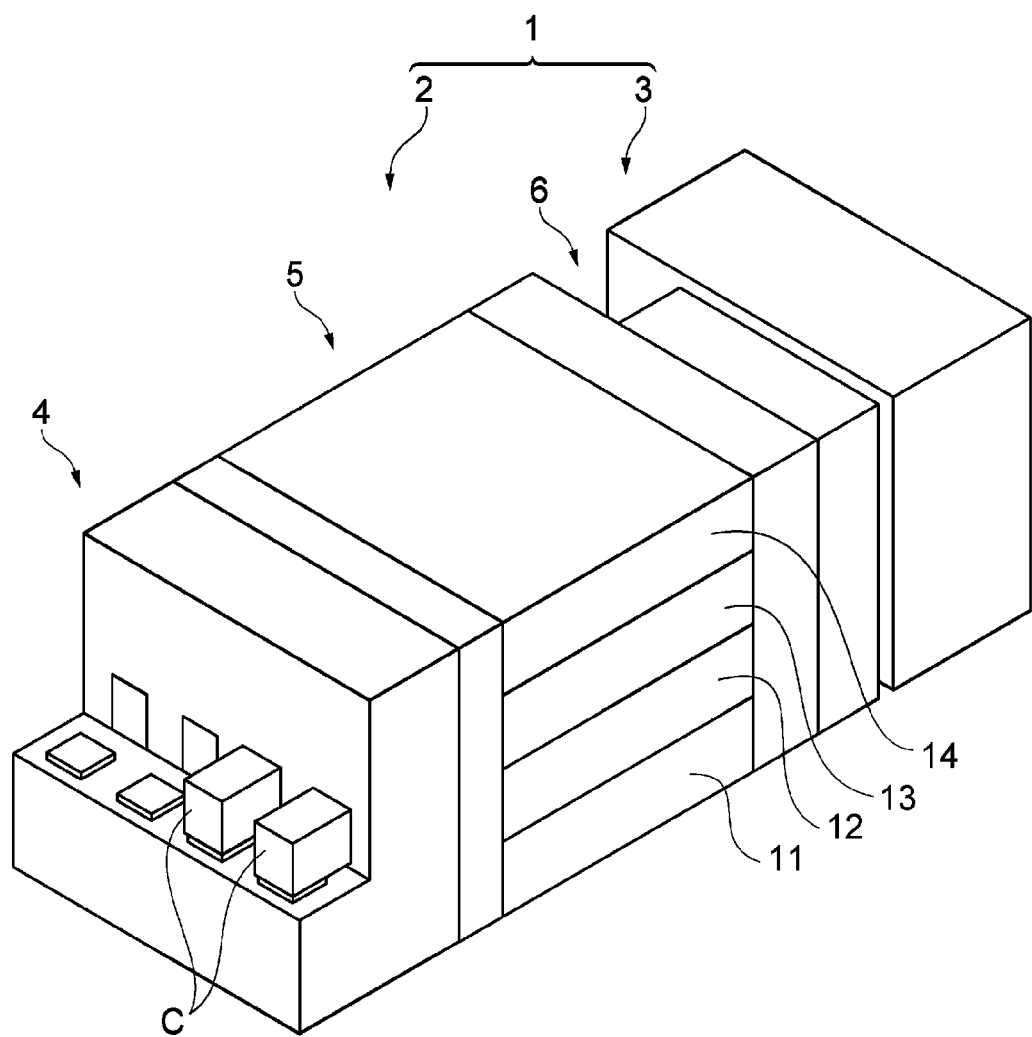
FIG. 1 is a perspective view illustrating an example of a substrate processing system.

Hereinafter, various exemplary embodiments will be described. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In an exemplary embodiment, a substrate processing apparatus is provided. The substrate processing apparatus for forming a coating film on a peripheral edge portion including a peripheral edge of a front surface of a substrate and a side surface of the substrate, includes: a substrate holder configured to rotatably hold the substrate; a first chemical liquid supplier configured to supply a first chemical liquid onto the peripheral edge of the substrate including a rear surface of the substrate; a partial removing part configured to remove, among the first chemical liquid supplied onto the substrate, the first chemical liquid adhering to at least a portion of the front surface and the side surface of the substrate; a second chemical liquid supplier configured to supply a second chemical liquid for forming the coating film onto the front surface and the side surface of the substrate; a first chemical liquid removing part configured to remove the first chemical liquid remaining on the substrate to which the second chemical liquid adheres; and a controller configured to control the substrate holder, the first chemical liquid supplier, the partial removing part, the second chemical liquid supplier, and the first chemical liquid removing part.

With the substrate processing apparatus described above, after the first chemical liquid is supplied to the peripheral edge of the substrate including the rear surface of the substrate, the first chemical liquid adhering at least the portion of the front surface and the side surface of the substrate is removed. Then, after supplying the second chemical liquid to the front surface and side surface of the substrate, the first chemical liquid remaining on the substrate is removed. As a result, when the second chemical liquid for forming the coating film is supplied, the rear surface of the substrate is in the state in which the first chemical liquid has adhered thereto. Thus, since the second chemical liquid is prevented from adhering to the rear surface of the substrate, it is possible to form the coating film on the front surface and the side surface of the substrate. Therefore, it is possible to form the coating film on the peripheral edge portion including the peripheral edge of the front surface and the side surface of the substrate while preventing the coating film from being formed on the rear surface of the substrate.

The first chemical liquid supplier may include a first nozzle provided close to the rear surface of the substrate so as to eject the first chemical liquid to the peripheral edge of the substrate, and the second chemical liquid supplier may include a second nozzle provided close to the front surface of the substrate so as to eject the second chemical liquid to the front surface and the side surface of the substrate.

By providing the first nozzle configured to eject the first chemical liquid in the vicinity of the rear surface of the substrate, it is possible to cause the first chemical to appropriately adhere to the peripheral edge including the rear surface of the substrate. Therefore, it is possible to form the coating film on the peripheral edge portion including the peripheral edge of the front surface and the side surface of the substrate while preventing the second chemical liquid from adhering to the rear surface of the substrate by the first chemical liquid.

The first chemical liquid supplier may include a first nozzle provided close to the front surface of the substrate so as to eject the first chemical liquid to the peripheral edge of the substrate, and the second chemical liquid supplier may include a second nozzle provided close to the front surface of the substrate so as to eject the second chemical liquid to the front surface and the side surface of the substrate.

By providing the first nozzle configured to eject the first chemical liquid in the vicinity of the front surface of the substrate, it is possible to prevent arranging a mechanism for supplying the first chemical liquid in the vicinity of the rear surface of the substrate from becoming complicated.

The partial removing part may include a third nozzle provided close to the front surface of the substrate so as to eject a solvent capable of removing the first chemical liquid to the substrate, and the controller may be configured to control the substrate holder and the partial removing part such that the solvent is ejected to the substrate in a state in which the substrate is rotated.

With the configuration of removing a portion of the first chemical liquid by supplying the solvent from the third nozzle while rotating the substrate, it is possible to appropriately remove the first chemical adhering to at least the portion of the front surface and the side surface of the substrate using the solvent. This makes it possible to appropriately adhere the second chemical liquid for forming the coating film to the front surface and side surface of the substrate.

The controller may be configured to control the substrate holder and the second chemical liquid supplier to supply the second chemical liquid in the state in which the substrate is rotated, and a number of revolutions of the substrate when supplying the second chemical liquid by the second chemical liquid supplier may be smaller than a number of revolutions of the substrate when supplying the solvent by the partial removing part.

As described above, by reducing the number of revolutions of the substrate when the second chemical liquid is supplied by the second chemical liquid supplier compared to the number of revolutions of the substrate when the solvent is supplied by the partial removing part, it is possible to prevent the solvent from moving toward the rear surface of the substrate. In addition, by reducing the number of revolutions of the substrate when supplying the second chemical liquid, it is possible to evenly supply the second chemical liquid to the substrate, and to prevent the second chemical liquid from scattering due to liquid splashing or the like.

The third nozzle may be configured to spray the solvent to the substrate in an atomized state. By spraying the solvent in an atomized state, it is possible to supply the solvent in a desired position on the substrate and adequately remove the first chemical liquid with the solvent.

The partial removing part may include a removing member capable of removing the first chemical liquid by coming into contact with the front surface and the side surface of the substrate in a state in which the substrate is rotated by the substrate holder. In this way, the removing member removes the first chemical liquid by coming into contact with the front surface and the side surface of the substrate. Thus, it is possible to adequately remove the first chemical liquid at a desired position.

In an exemplary embodiment, a substrate processing method is provided. The substrate processing method of forming a coating film on a peripheral edge portion including a peripheral edge of a front surface of a substrate and a side surface of the substrate, may include: supplying a first chemical liquid onto the peripheral edge of the substrate including a rear surface of the substrate; removing, among the first chemical liquid supplied onto the substrate, the first chemical liquid adhering to at least a portion of the front surface and the side surface of the substrate; supplying a second chemical liquid for forming the coating film on the front surface and the side surface of the substrate; and removing the first chemical liquid remaining on the substrate to which the second chemical liquid adheres.

With the substrate processing method described above, after the first chemical liquid is supplied to the peripheral edge of the substrate including the rear surface of the substrate, the first chemical liquid adhering to at least the portion of the front surface and the side surface of the substrate is removed. Then, after supplying the second chemical liquid to the front surface and side surface of the substrate, the first chemical liquid remaining on the substrate is removed. As a result, when the second chemical liquid for forming the coating film is supplied, the rear surface of the substrate is in the state in which the first chemical liquid has adhered thereto. Thus, since the second chemical liquid is prevented from adhering to the rear surface of the substrate, it is possible to form the coating film on the front surface and the side surface of the substrate. Therefore, it is possible to form the coating film on the peripheral edge portion including the peripheral edge of the front surface and the side surface of the substrate while preventing the coating film from being formed on the rear surface of the substrate.

In an exemplary embodiment, a non-transitory computer-readable storage medium is provided. The non-transitory computer-readable storage medium may store a program for causing an apparatus to execute the aforementioned method. The storage medium described above has the same effect as the substrate processing method described above.

Hereinafter, embodiments will be described with reference to the drawings. In the description, the same elements or elements having the same function will be denoted by the same reference numerals, and a redundant description thereof will be omitted.

[Substrate Processing System]

A substrate processing system 1 shown in FIG. 1 is a system that forms, exposes, and develops a photosensitive film on a workpiece W. The workpiece W to be processed is, for example, a substrate, or a substrate in which a film, a circuit, or the like is formed by being subjecting to a predetermined process. The substrate included in the workpiece W is, for example, a wafer containing silicon. The workpiece W (substrate) may be formed in a circular shape.

The workpiece W to be processed may be a glass substrate, a mask substrate, a FPD (Flat Panel Display), or the like, or may be an intermediate body obtained by subjecting these substrates or the like to a predetermined process. The photosensitive film is, for example, a resist film.

The substrate processing system 1 includes a coating/developing apparatus 2, an exposing apparatus 3 and a controller 100 (control unit). The exposing apparatus 3 is an apparatus that exposes a resist film (photosensitive film) formed on the workpiece W (substrate). Specifically, the exposing apparatus 3 irradiates an exposure-target portion of the resist film with an energy ray by a method such as immersion exposure. The coating/developing apparatus 2 performs a process of forming the resist film by coating a resist (chemical solution) onto the surface of the workpiece W before the exposing process by the exposing apparatus 3, and performs a developing process for the resist film after the exposing process.

[Substrate Processing Apparatus]

Figure 2:
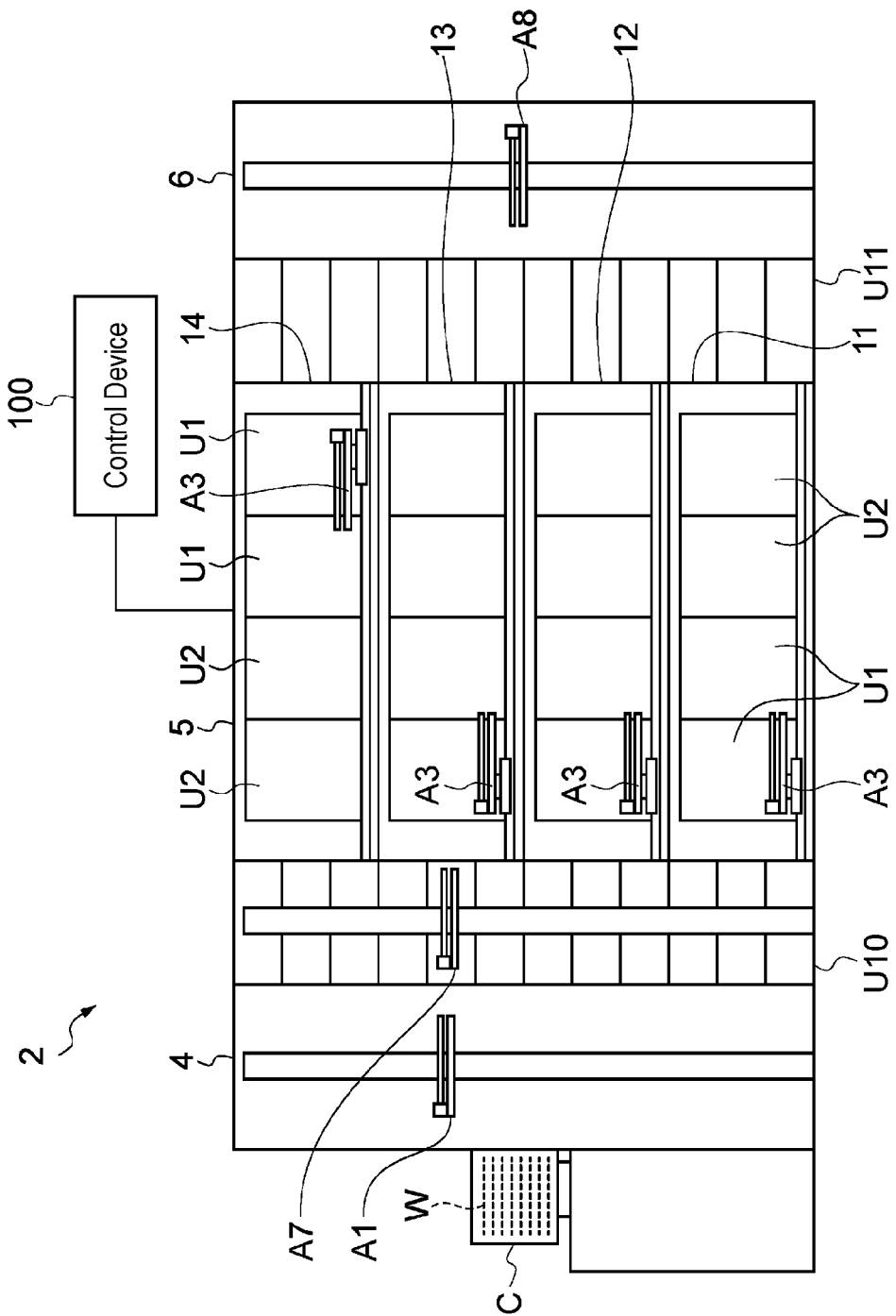
FIG. 2 is a side view schematically illustrating an example of an interior of the substrate processing system.

Hereinafter, the configuration of the coating/developing apparatus 2, which is an example of a substrate processing apparatus, will be described. As shown in FIGS. 1 and 2, the coating/developing apparatus 2 includes a carrier block 4, a processing block 5, and an interface block 6.

The carrier block 4 loads the workpiece W into the coating/developing apparatus 2 and unloads the workpiece W from the coating/developing apparatus 2. For example, the carrier block 4 can support a plurality of carriers C for the workpiece W and includes a transfer device A1 equipped with a transfer arm. Each of the carriers C accommodates, for example, a plurality of circular workpieces W. The transfer device A1 takes out the workpiece W from the carrier C, passes the same to the processing block 5, receives the workpiece W from the processing block 5, and returns the same to the carrier C. The processing block 5 has a plurality of processing modules 11, 12, 13, and 14.

The processing module 11 incorporates a coating unit U1, a heat treatment unit U2, and a transfer device A3 for transferring the workpiece W to these units. The processing module 11 forms a lower layer film on the surface of the workpiece W by the coating unit U1 and the heat treatment unit U2. The coating unit U1 coats a processing liquid for formation of the lower layer film on the workpiece W. The heat treatment unit U2 performs various heat treatments related to the formation of the lower layer film.

The processing module 12 (liquid processing unit) incorporates a coating unit U1, a heat treatment unit U2, and a transfer device A3 for transferring the workpiece W to these units. The processing module 12 performs a liquid process which includes forming a resist film on a lower layer film by the coating unit U1 and the heat treatment unit U2. The coating unit U1 coats a processing liquid (resist) for formation of the resist film on the lower layer film. The heat treatment unit U2 performs various heat treatments related to the formation of the resist film. The heat treatment unit U2 has a function of forming, on the periphery of the workpiece W, a coating film based on the resist liquid.

The processing module 13 incorporates a coating unit U1, a heat treatment unit U2, and a transfer device A3 for transferring the workpiece W to these units. The processing module 13 forms an upper layer film on the resist film by the coating unit U1 and the heat treatment unit U2. The coating unit U1 coats a liquid for formation of the upper layer film on the resist film. The heat treatment unit U2 performs various heat treatments related to the formation of the upper layer film.

The processing module 14 incorporates a coating unit U1, a heat treatment unit U2, and a transfer device A3 for transferring the workpiece W to these units. The processing module 14 performs development of the resist film subjected to the exposing process and heat treatment related to the development by the coating unit U1 and the heat treatment unit U2. The coating unit U1 develops the resist film by coating a developer on the surface of the exposed workpiece W and then rinsing the developer with a rinsing liquid. The heat treatment unit U2 performs various heat treatments related to the development. Specific examples of the heat treatment may include heat treatment before development (PEB: Post Exposure Bake), heat treatment after development (PB: Post Bake), and the like.

A shelf unit U10 is provided close to the carrier block 4 inside the processing block 5. The shelf unit U10 is partitioned into a plurality of cells arranged in a vertical direction. A transfer device A7 including an elevating arm is provided in the vicinity of the shelf unit U10. The transfer device A7 raises and lowers the workpiece W between the cells of the shelf unit U10.

A shelf unit U11 is provided close to the interface block 6 inside the processing block 5. The shelf unit U11 is partitioned into a plurality of cells arranged in the vertical direction.

The interface block 6 transfers the workpiece W to and from the exposing apparatus 3. For example, the interface block 6 incorporates a transfer device A8 including a transfer arm and is connected to the exposing apparatus 3. The transfer device A8 delivers the workpiece W disposed on the shelf unit U11 to the exposing apparatus 3. The transfer device A8 receives the workpiece W from the exposing apparatus 3 and transfer the same to the shelf unit U11.

[Coating Unit]

Figure 3:
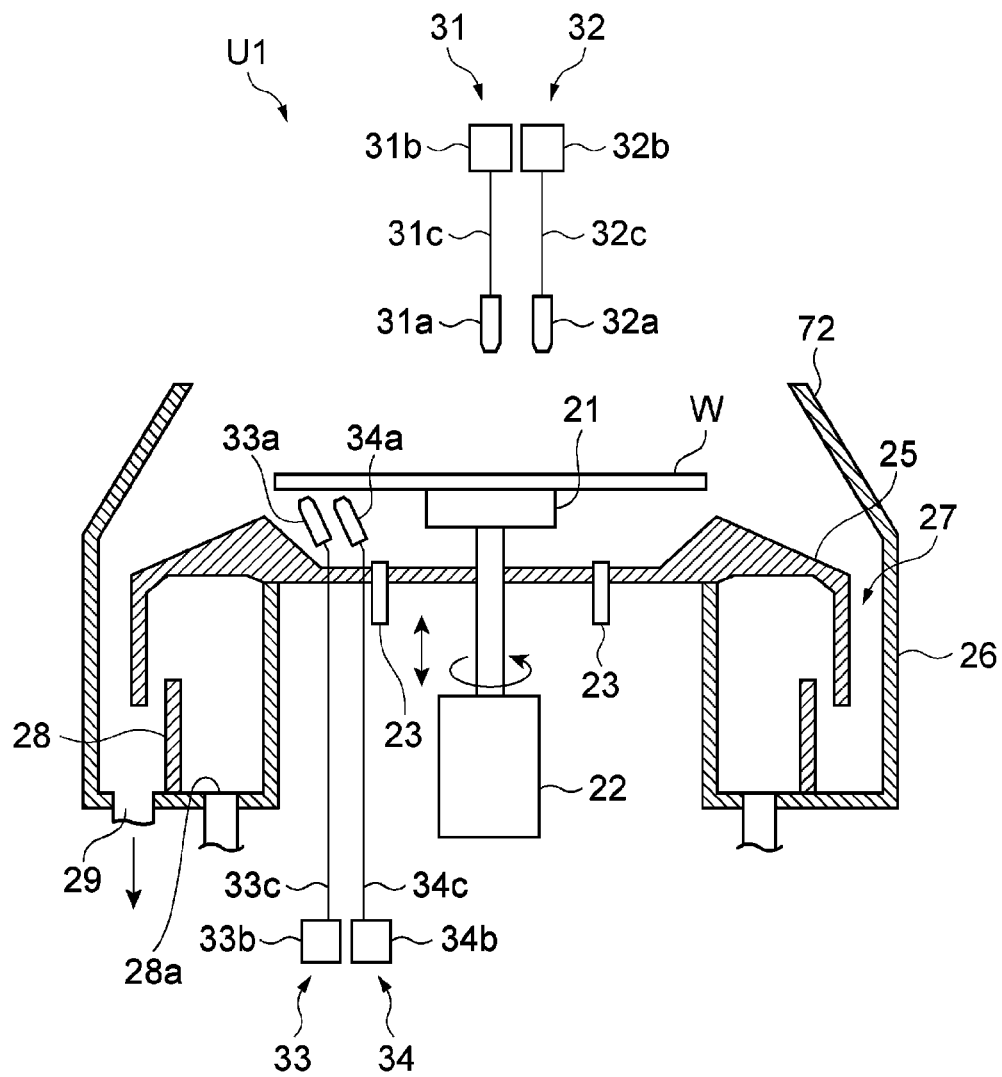
FIG. 3 is a schematic view illustrating an example of a coating unit.

Next, the coating unit U1 of the processing module 12 will be described. As illustrated in FIG. 3, the coating unit U1 of the processing module 12 includes a spin chuck 21 (substrate holder), a rotational driver 22, support pins 23, a guide ring 25, a cup 26, an exhaust pipe 28, and a drainage port 29. In addition, the coating unit U1 includes a first processing liquid supplier 31, a second processing liquid supplier 32, a third processing liquid supplier 33, and a fourth processing liquid supplier 34.

The first to fourth processing liquid suppliers 31 to 34 supply processing liquids to be used when forming a coating film on the peripheral edge portion of the workpiece W, respectively.

The spin chuck 21 holds the workpiece W horizontally. The spin chuck 21 is connected to the rotational driver 22 via a shaft extending in the up-and-down direction (the vertical direction). The rotational driver 22 rotates the spin chuck 21 at a predetermined rotation speed based on a control signal output from the control device 100.

The support pins 23 are pins capable of supporting the rear surface of the workpiece W. For example, three support pins 23 are provided around the shaft of the spin chuck 21. The support pins 23 are capable of being raised and lowered by a lifting mechanism (not illustrated). The workpiece W is delivered between a transfer mechanism (not illustrated) for the workpiece W and the spin chuck 21 by the support pins 23.

The guide ring 25 is provided below the workpiece W held by the spin chuck 21 and has a function of guiding the processing liquid supplied to the front surface of the workpiece W toward the drainage port 29. In addition, a cup 26 for suppressing the scattering of the processing liquid is provided so as to surround the outer periphery of the guide ring 25. An upper portion of the cup 26 is open such that the workpiece W can be delivered to the spin chuck 21 through the opening. A space 27 serving as a liquid discharge path is formed between the side peripheral surface of the cup 26 and the outer periphery of the guide ring 25. In addition, the exhaust pipe 28 having an exhaust port 28a and the drainage port 29 for discharging the liquid moving in the space 27 therethrough are provided below the cup 26.

The coating unit U1 is provided with four processing liquid suppliers for supplying four types of processing liquids. A first processing liquid supplier 31 (a partial removing part) and a second processing liquid supplier 32 (a second chemical liquid supplier) eject processing liquids from above the workpiece W supported by the spin chuck 21 toward the peripheral edge of the front surface of the workpiece W. A third processing liquid supplier 33 (a first chemical liquid supplier) and a fourth processing liquid supplier 34 (a first chemical liquid remover) eject processing liquids from below the workpiece W supported by the spin chuck 21 toward the peripheral edge of the rear surface of the workpiece W.

The first processing liquid supplier 31 includes a nozzle 31a (a third nozzle), a processing liquid source 31b, and a pipe 31c. Similarly, the second processing liquid supplier 32 includes a nozzle 32a (a second nozzle), a processing liquid source 32b, and a pipe 32c. The third processing liquid supplier 33 includes a nozzle 33a (a first nozzle), a processing liquid source 33b, and a pipe 33c. The fourth processing liquid supplier 34 includes a nozzle 34a, a processing liquid source 34b, and a pipe 34c. An opening/closing valve to be controlled by the control device 100 may be provided in each of the pipes of the first to fourth processing liquid suppliers 31 to 34. The supply/cutoff of the processing liquid may be switched by switching the opening/closing valve between the open state and the closed state based on a control signal from the control device 100.

An example of the processing liquid supplied from the first processing liquid supplier 31 may be, for example, a solvent. An example of the solvent supplied from the first processing liquid supplier 31 may be, for example, a solvent (e g, thinner) capable of dissolving the processing liquid supplied from the third processing liquid supplier 33. An example of the processing liquid supplied from the second processing liquid supplier 32 may be, for example, a processing liquid (e.g., a resist liquid) used when forming a coating film on the peripheral edge of the workpiece W. An example of the processing liquid supplied from the third processing liquid supplier 33 may be, for example, a liquid that is capable of adhering to an end surface of the workpiece W and is soluble in the solvent supplied from the first processing liquid supplier 31. An example of the processing liquid supplied from the fourth processing liquid supplier 34 may be, for example, a solvent that is capable of removing the processing liquid supplied from the third processing liquid supplier 33 and is not capable of dissolving the processing liquid supplied from the second processing liquid supplier 32. In the following description, the processing liquid supplied from the third processing liquid supplier 33 may be referred to as a first chemical liquid R1, and the processing liquid (processing liquid for coating film formation) supplied from the second processing liquid supplier 32 may be referred to as a second chemical liquid R2. In addition, the solvent supplied from the first processing liquid supplier 31 may be referred to as a first solvent F1, and the solvent supplied from the fourth processing liquid supplier 34 may be referred to as a second solvent F2. From the relationship described above, different chemicals may be selected for the first chemical liquid R1 and the second chemical liquid R2. In addition, different chemicals may be selected for the first solvent F1 and the second solvent F2. However, for example, the same kind of chemicals may be selected as the first solvent F1 and the second solvent F2.

In addition, as used in the present embodiment, when a specific chemical liquid "dissolves" in a specific solvent, it means that, when the specific chemical liquid is mixed with the specific solvent, each component constituting the chemical liquid becomes movable rather than dissolving in the solvent. Specifically, a state in which a specific chemical liquid adheres to a workpiece W and does not move is a state in which components constituting the chemical liquid (e.g., resin particles in the case of a resist liquid) are close to each other. When a specific solvent is mixed with the chemical liquid in this state, the solvent enters between the components constituting the chemical liquid. As a result, each component in the chemical liquid becomes movable (flowable), and the chemical liquid is removed from a region to which the chemical liquid has adhered. The term "dissolve" in the present embodiment means the state in which a chemical liquid becomes movable as described above, and as a result, the chemical liquid is turned into the state of being removable.

The nozzle 31a of the first processing liquid supplier 31 and the nozzle 32a of the second processing liquid supplier 32 are attached to, for example, an arm extending in the horizontal direction and are movable in the horizontal direction. In addition, the nozzles 31a and 32a are also movable in the vertical direction. A movement mechanism configured to move the nozzles 31a and 32a in the horizontal direction and the vertical direction is provided. Thus, the nozzles 31a and 32a move between a standby position outside the cup 26 and a position above the workpiece W with the operation of the movement mechanism.

The nozzle 33a of the third processing liquid supplier 33 and the nozzle 34a of the fourth processing liquid supplier 34 are also movable in the vertical direction and the horizontal direction by the movement mechanism, similarly to the nozzles 31a and 32a. Standby positions of the nozzles 33a and 34a may be provided separately from the standby positions of the nozzles 31a and 32a.

As the nozzles 31a to 34a, nozzles having a processing liquid ejection port having a small diameter (e.g., an ejection port diameter of about 0.2 mm to 1.2 mm) may be used. When the nozzles having such a small diameter are used, it is possible to appropriately supply the processing liquids to specific positions on the workpiece W by moving the positions of the nozzles in the vertical direction and the horizontal direction. However, diameters and shapes of the nozzles 31a to 34a are not limited to the above example.

The control device 100 controls the coating/developing apparatus 2. The control device 100 causes the processing module 12 to execute a liquid process on the workpiece W according to predetermined conditions. The control device 100 causes the first to fourth processing liquid suppliers 31 to 34 to supply the respective processing liquids to the workpiece W based on, for example, predetermined conditions, and controls the rotation or the like of the workpiece W at that time. The control device 100 may be constituted with a plurality of functional modules for executing the above liquid process. Each functional module is not limited to that implemented by executing a program, and may be realized by a dedicated electric circuit (e.g., a logic circuit) or an integrated circuit in which the electric circuit is integrated (application-specific integrated circuit (ASIC)).

Figure 4:
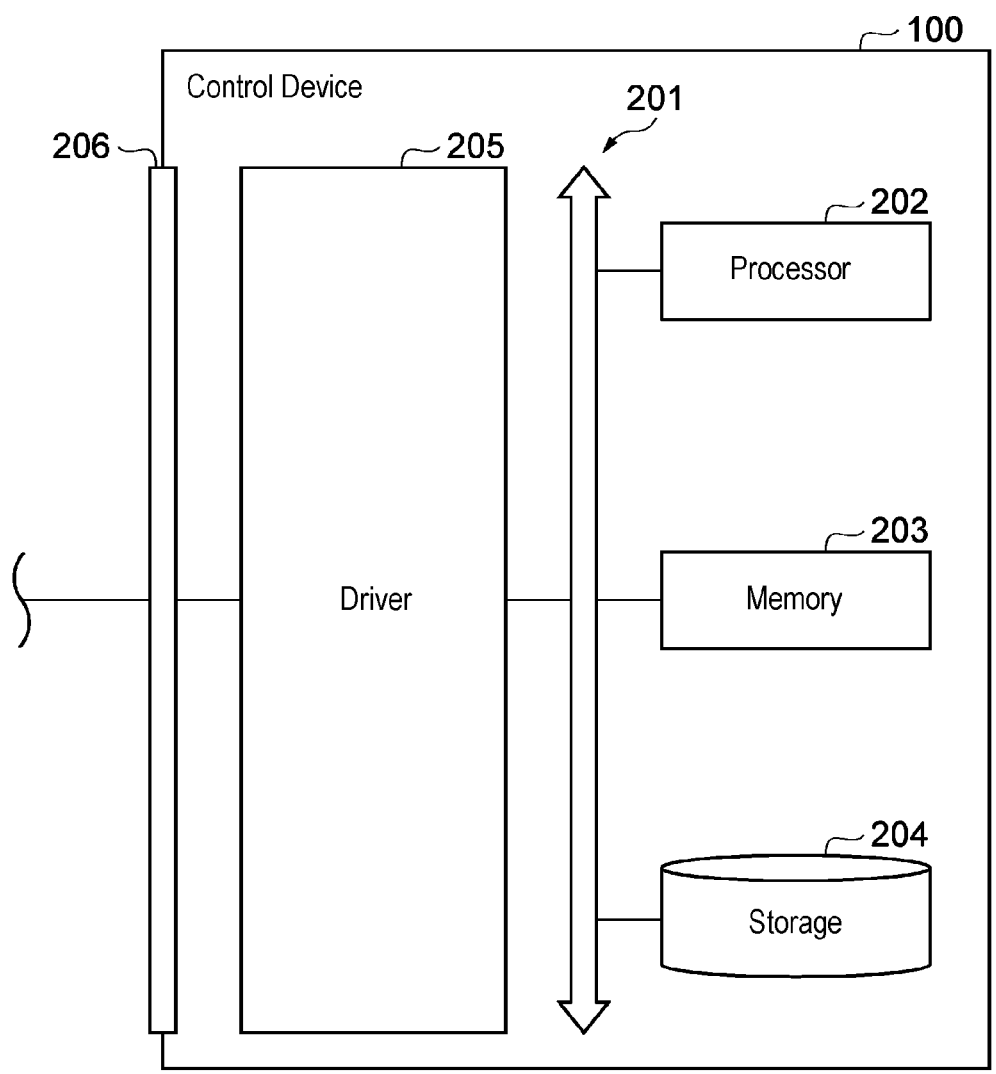
FIG. 4 is a block diagram illustrating an example of a hardware configuration of a control device.

The hardware of the control device 100 may constitute one or more control computers. As illustrated in FIG. 4, the control device 100 includes a circuit 201 as a hardware configuration. The circuit 201 may be constituted with an electric circuit element (circuitry). The circuit 201 may include a processor 202, a memory 203, a storage 204, a driver 205, and an input/output port 206.

The processor 202 constitutes each of the above-mentioned functional modules by executing a program in cooperation with at least one of the memory 203 and the storage 204 and executing input/output of a signal via the input/output port 206. The memory 203 and the storage 204 are non-transitory computer-readable storage mediums and store various information, programs, or the like to be used by the control device 100. The driver 205 is a circuit that drives various parts of the coating/developing apparatus 2. The input/output port 206 inputs/outputs a signal between the driver 205 and parts that constitute the coating/developing apparatus 2.

The substrate processing system 1 may include a single control device 100, or may include a controller group (control part) including a plurality of control devices 100. When the substrate processing system 1 includes the controller group, for example, each of the plurality of functional modules may be implemented by one control device different from the others, or may be implemented by a combination of two or more control devices 100. When the control device 100 is constituted with a plurality of computers (the circuit 201), each of the plurality of functional modules may be implemented by one computer (the circuit 201). In addition, the control device 100 may be implemented by a combination of two or more computers (the circuit 201). The control device 100 may include a plurality of processors 202. In this case, each of the plurality of functional modules may be implemented by one processor 202, or may be implemented by a combination of two or more processors 202. Various operations in the present embodiment may be implemented by providing some of the functions of the control device 100 of the substrate processing system 1 to an apparatus separate from the substrate processing system 1 and connecting the apparatus to the substrate processing system 1 via a network. For example, when the functions of the processors 202, the memories 203, and the storages 204 of a plurality of substrate processing systems 1 are collectively implemented by one or more separate apparatuses, it is possible to collectively remotely manage and control the information or operations of the plurality of substrate processing systems 1.

Next, a processing of the workpiece W executed in the substrate processing system 1 will be described. The control device 100 controls the coating/developing apparatus 2 to execute a coating/developing process on the workpiece W, for example, in the following procedure. First, the control device 100 controls the transfer device A1 to transfer the workpiece W in the carrier C to the shelf unit U10, and controls the transfer device A7 to arrange the workpiece W in a cell for the processing module 11.

Subsequently, the control device 100 controls the transfer device A3 to transfer the workpiece W in the shelf unit U10 to the coating unit U1 and the heat treatment unit U2 in the processing module 11. In addition, the control device 100 controls the coating unit U1 and the heat treatment unit U2 to form an underlayer film on the front surface of the workpiece W. Thereafter, the control device 100 controls the transfer device A3 to return the workpiece W having the underlayer film formed thereon to the shelf unit U10, and controls the transfer device A7 to arrange the workpiece W in the processing module 12.

Subsequently, the control device 100 controls the transfer device A3 to transfer the workpiece W in the shelf unit U10 to the coating unit U1 and the heat treatment unit U2 in the processing module 12. In addition, the control device 100 controls the coating unit U1 and the heat treatment unit U2 to form a resist film on the underlayer film of the workpiece W. An example of a liquid processing method performed in the processing module 12 will be described later. Thereafter, the control device 100 controls the transfer device A3 to return the workpiece W to the shelf unit U10, and controls the transfer device A7 to arrange the workpiece W in a cell for the processing module 13.

Subsequently, the control device 100 controls the transfer device A3 to transfer the workpiece W in the shelf unit U10 to the coating unit U1 and the heat treatment unit U2 in the processing module 13. In addition, the control device 100 controls the coating unit U1 and the heat treatment unit U2 to form an upper-layer film on the resist film of the workpiece W. Thereafter, the control device 100 controls the transfer device A3 to transfer the workpiece W to the shelf unit U11.

Subsequently, the control device 100 controls the transfer device A8 so as to send the workpiece W accommodated in the shelf unit U11 to the exposure apparatus 3. Then, in the exposure apparatus 3, an exposure process is performed on the resist film formed on the workpiece W. Thereafter, the control device 100 controls the transfer device A8 to receive the workpiece W, which has been subjected to the exposure process by the exposure apparatus 3, and to arrange the workpiece W in a cell for the processing module 14 in the shelf unit U11.

Subsequently, the control device 100 controls the transfer device A3 to transfer the workpiece W in the shelf unit U11 to the heat treatment unit U2 in the processing module 14. Then, the control device 100 controls the coating unit U1 and the heat treatment unit U2 to execute the development process and the heat treatment associated with the development process. In this manner, the control device 100 terminates a substrate process for one sheet of workpiece W.

[Substrate Processing Method]

Figure 5:
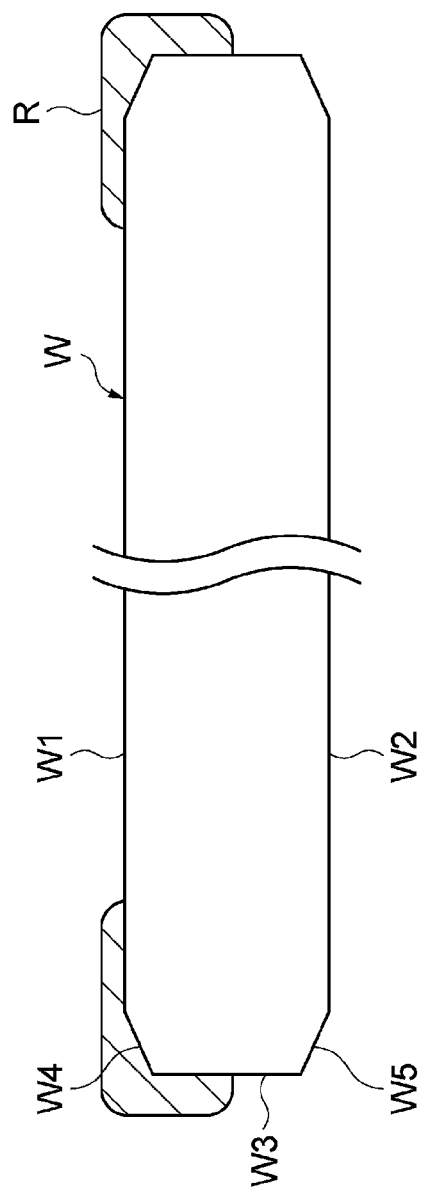
FIG. 5 is a schematic view illustrating an example of a shape of a coating film formed on a workpiece.

Next, an example of a substrate processing method performed in the processing module 12 will be described. Here, as the liquid processing method, a method of forming a coating film using a resist film on the peripheral edge portion of the workpiece W will be described. FIG. 5 illustrates an example of the workpiece W in which a coating film R is formed on the peripheral edge portion. In the processing module 12, a coating film (a resist film) is also formed on a portion of the front surface W1 of the workpiece W other than the peripheral edge portion, but the description of the coating film on the portion other than the peripheral edge portion will be omitted. The coating film R coated on the peripheral edge portion of the workpiece W is provided to protect a region of the front surface W1 of the workpiece W that is different from the central portion in which a resist pattern is formed.

As illustrated in FIG. 5, the workpiece W has the front surface W1 and a rear surface W2, which constitute a pair of main surfaces, and a band-shaped side surface W3 extending in a direction orthogonal to the front surface W1 and the rear surface W2. In addition, an inclined surface W4 is formed between the front surface W1 and the side surface W3 of the workpiece W, and an inclined surface W5 is also formed between the rear surface W2 and the side surface W3. Of these, the coating film R is formed, for example, as a film having a thickness of about 10 nm to 100 μm in a region spaced apart by several mm in the radial direction from the side surface W3 of the workpiece W. In addition, the coating film R is also formed on the inclined surface W4 and the side surface W3. Specifically, the coating film R is formed on the upper portion of the side surface W3 in a region of about 30% to 100% of the height (length) of the side surface W3 in the thickness direction of the workpiece W (the direction orthogonal to the front surface W1 and the rear surface W2). The thickness of the coating film R on the side surface W3 is, for example, about 10 nm to 100 μm.

As described above, the coating film R is formed so as to cover the peripheral edge of the front surface W1 of the workpiece W and a portion of the inclined surface W4 and the side surface W3 continuous from the peripheral edge of the front surface W1. This makes it possible to protect the front surface W1 of the workpiece W even in a portion of the inclined surface W4 and the side surface W3 of the workpiece W. That is, the peripheral edge portion of the workpiece W on which the coating film R is formed refers to the peripheral edge of the front surface W1 and the portion of the inclined surface W4 and the side surface W3 continuous from the peripheral edge of the front surface W1. However, considering that the workpiece W is transferred after the coating film R is formed, it is necessary to prevent the coating film R from being formed on the inclined surface W5 and the rear surface W2 of the workpiece W.

Figure 6:
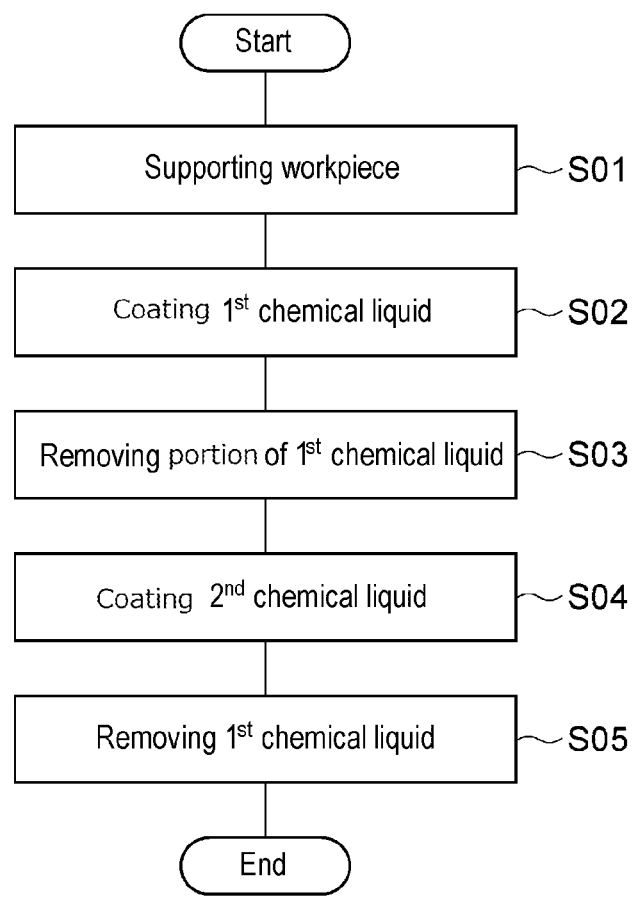
FIG. 6 is a flowchart illustrating an example of a substrate processing method.

FIG. 6 illustrates an example of a processing procedure for forming the coating film R on the peripheral edge portion of the front surface W1 of the workpiece W and the portion of the inclined surface W4 and the side surface W3 continuous from the peripheral edge of the front surface W1 as in the workpiece W illustrated in FIG. 5. In addition, FIGS. 7A to 7F are views for explaining the states of the peripheral edge of the workpiece W in respective procedures illustrated in FIG. 6. Further, FIGS. 7A to 7F and FIGS. 8A to 8F to be described later show only a portion of the cross section of the workpiece W (around the peripheral edge portion). Since each processing liquid is supplied to the workpiece W while the workpiece W is being rotated as will be described later, each processing liquid is coated onto (adheres to) the workpiece W in a ring shape.

As illustrated in FIG. 6, the control device 100 executes step S01. In step S01, the control device 100 controls the transfer device A3 and the support pins 23 of the coating unit U1 to support the workpiece W on the spin chuck 21 in the coating unit U1.

Figure 7A:
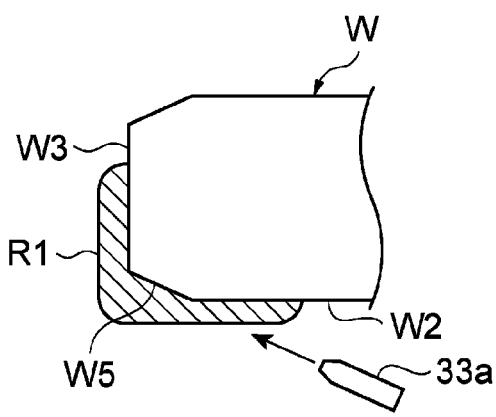
FIGS. 7A to 7F are schematic views for explaining an example of the substrate processing method.

Subsequently, the control device 100 executes step S02. In step S02, in the state in which the workpiece W is rotated by driving the rotational driver 22, the control device 100 controls the third processing liquid supplier 33 to eject the first chemical liquid from the nozzle 33a toward the rear surface W2 of the workpiece W. As a result, as illustrated in FIG. 7A, the first chemical liquid R1 adheres to the rear surface W2, the inclined surface W5, and the side surface W3 of the workpiece W.

Figure 7B:
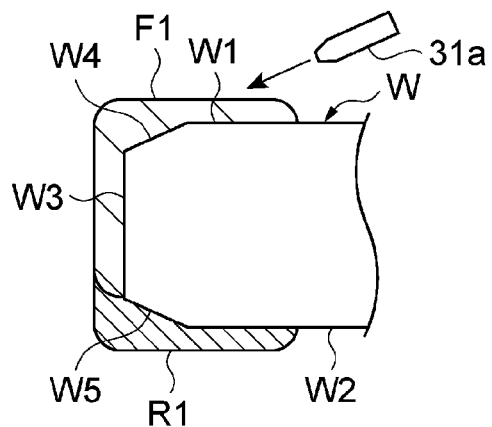

Subsequently, the control device 100 executes step S03. In step S03, in the state in which the workpiece W is rotated by driving the rotational driver 22, the control device 100 controls the first processing liquid supplier 31 to eject the first solvent F1 from the nozzle 31a toward the front surface W1 of the workpiece W. As a result, as illustrated in FIG. 7B, the first solvent F1 adheres onto the front surface W1, the inclined surface W4 and the side surface W3 of the workpiece W. By controlling the number of revolutions of the workpiece W by the rotational driver 22, the first solvent F1 supplied to the front surface W1 of the workpiece W spreads onto the front surface W1, the inclined surface W4 and the side surface W3 while spreading toward the outer periphery of the workpiece W. By adjusting the number of revolutions, it is possible to control the spread of the first solvent F1 on the workpiece W. Although the number of revolutions varies depending on the type and characteristics of the solvent, the size of the workpiece W, and the like, the number of revolutions of the workpiece W increases to some extent such that the first solvent F1 reaches the side surface W3 of the workpiece W, but does not reach to the inclined surface W5 and the rear surface W2 of the workpiece W. That is, the number of revolutions of the workpiece W in step S02 is controlled such that the first solvent F1 is movable outward of the workpiece W and is difficult to flow around the inclined surface W5 and the rear surface W2. As an example, the number of revolutions of the workpiece W at this time is about 1,000 rpm to 4,000 rpm.

Figure 7C:
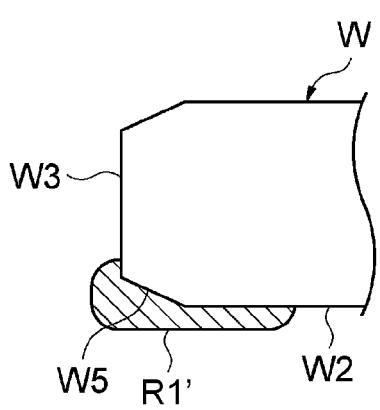

The first chemical liquid R1 consists of a chemical that is removable by the first solvent F1. Therefore, when the solvent is supplied on the top of the first chemical liquid R1, which has adhered onto the workpiece W, the first chemical liquid R1 is removed. As a result, as illustrated in FIG. 7C, the first chemical liquid R1 in the region to which the first solvent F1 was supplied is removed, and consequently, a partially-removed first chemical liquid R1' remains.

Figure 7D:
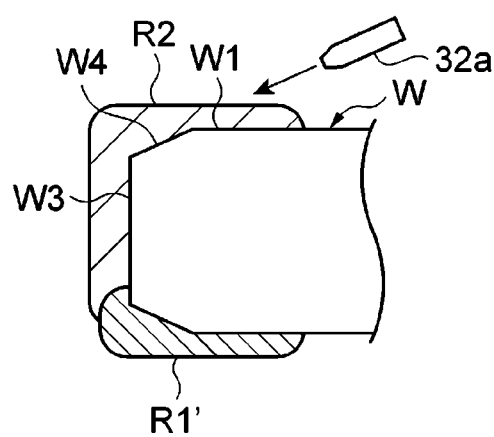

Subsequently, the control device 100 executes step S04. In step S04, in the state in which the workpiece W is rotated by driving the rotational driver 22, the control device 100 controls the second processing liquid supplier 32 to eject the second chemical liquid from the nozzle 32a. As a result, as illustrated in FIG. 7D, the second chemical liquid R2 adheres onto the front surface W1, the inclined surface W4, and the side surface W3 of the workpiece W. By controlling the number of revolutions of the workpiece W by the rotational driver 22, the second chemical liquid R2 supplied to the front surface W1 of the workpiece W spreads onto the front surface W1, the inclined surface W4, and the side surface W3 while spreading toward the outer periphery of the workpiece W. By adjusting the number of revolutions, it is possible to control the spread of the second chemical liquid R2 on the workpiece W. Since the second chemical liquid R2 spreads along each surface of the workpiece W, the second chemical liquid R2 spreads along the region where the first chemical liquid R1 has been removed by the first solvent F1 and the region where the first chemical liquid R1 has not originally adhered. The second chemical liquid R2 does not have a property capable of removing the first chemical liquid R1. Thus, as illustrated in FIG. 7D, even when the second chemical liquid R2 spreads to the top of the partially-removed first chemical liquid R1', it is impossible for the second chemical liquid R2 to remove the first chemical liquid R1'. Thus, the second chemical liquid R2 is in the state of adhering to the top of the partially-removed first chemical liquid R1'.

Although the number of revolutions of the workpiece W varies depending on the type and characteristics of the second chemical liquid R2, the size of the workpiece W, or the like, when it is desired to control the spread of the second chemical liquid R2 such that the second chemical liquid R2 reaches the side surface W3 of the workpiece W, the number of revolutions of the workpiece W is adjusted to be small to some extent. That is, the number of revolutions of the workpiece W in step S04 becomes smaller than the number of revolutions when the first solvent F1 is spread outward from the center side of the front surface W1 of the workpiece W (the number of revolutions in step S02). As an example, the number of revolutions of the workpiece W at this time is set to 1,000 rpm or less.

Figure 7E:
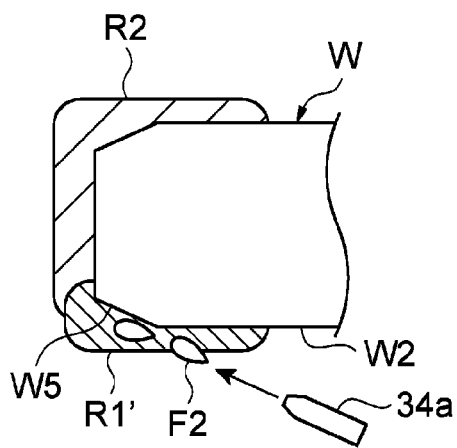
Figure 7F:
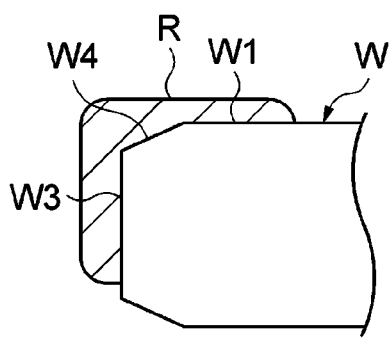

Subsequently, the control device 100 executes step S05. In step S05, in the state in which the workpiece W is rotated by driving the rotational driver 22, the control device 100 controls the fourth processing liquid supplier 34 to eject the second solvent F2 from the nozzle 34a toward the rear surface W2 of the workpiece W. As a result, as illustrated in FIG. 7E, the partially-removed first chemical liquid R1' remaining under the rear surface W2, the inclined surface W5, and the side surface W3 of the workpiece W and the second solvent F2 come into contact with each other. The partially-removed first chemical liquid R1' consists of a chemical that is removable by the second solvent F2. Therefore, when the solvent is supplied to the top of the partially-removed first chemical liquid R1', which has adhered to the workpiece W, the partially-removed first chemical liquid R1' is removed. The second solvent F2 is ejected to such an extent that the partially-removed first chemical liquid R1', which has adhered to the workpiece W, is fully removed. Meanwhile, as the second chemical liquid R2, a chemical liquid or solvent is selected such that the second chemical liquid R2 is not removed from the workpiece W by the second solvent F2. As a result, as illustrated in FIG. 7F, the partially-removed first chemical liquid R1' is removed, and the second chemical liquid R2 remains unremoved. This second chemical liquid R2 becomes the coating film R formed on the workpiece W.

By the process described above, the coating film R illustrated in FIG. 5 is formed on the peripheral edge portion of the workpiece W. Although FIG. 6 illustrates only the coating of the processing liquid (the chemical liquid or solvent) to the workpiece W, a heating process, a drying process, or the like may be performed between respective steps for the purpose of fixing the chemical liquid, promoting the removal process with the solvent, or the like. When performing the heating process, for example, the workpiece W may be moved to the heat treatment unit U2 where the workpiece W is to be subjected to the heat treatment.

(First Modification of Substrate Processing Method)

A modification of the substrate processing method illustrated in FIG. 6 and FIGS. 7A to 7F will be described with reference to FIGS. 8A to 8F. The substrate processing method according to this modification also performs processes in the same order as the flowchart illustrated in FIG. 6, but specific processing methods in some steps are different from those of the substrate processing method described above. In the following description, the different steps will be mainly described.

The control device 100 executes step S01. In step S01, the control device 100 controls the transfer device A3 and the support pins 23 of the coating unit U1 to support the workpiece W on the spin chuck 21 in the coating unit U1.

Figure 8A:
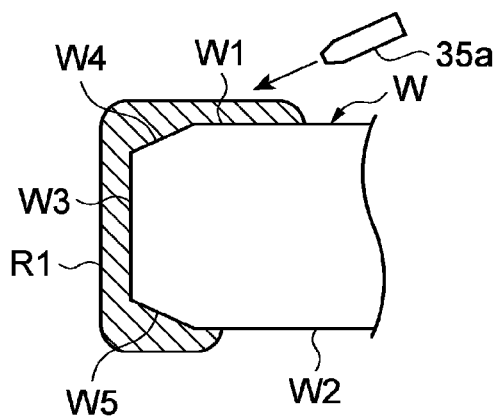
FIGS. 8A to 8F are schematic views for explaining a modification of a substrate processing method.

Subsequently, the control device 100 executes step S02. In step S02, the control device 100 supplies the first chemical liquid in the state in which the workpiece W is rotated by driving the rotational driver 22. Here, in the substrate processing method according to the modification, the first chemical liquid is supplied starting from the front surface of the workpiece W. Therefore, instead of the nozzle 33a of the third processing liquid supplier 33, the first chemical liquid is ejected from the nozzle 35a provided close to the front surface of the workpiece W toward the front surface W1 of the workpiece W. At this time, the control device 100 controls the number of revolutions of the workpiece W and the like so that the first chemical liquid R1 reaches the rear surface W2 from the front surface W1 of the workpiece W via the side surface W3, as illustrated in FIG. 8A. As a result, the first chemical liquid R1 adheres to the front surface W1, the inclined surface W4, the rear surface W2, the inclined surface W5, and the side surface W3 of the workpiece W.

Figure 8B:
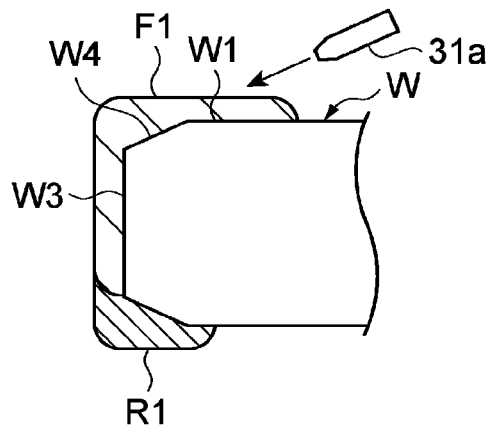

Subsequently, the control device 100 executes step S03. In step S03, in the state in which the workpiece W is rotated by driving the rotational driver 22, the control device 100 controls the first processing liquid supplier 31 to eject the first solvent F1 from the nozzle 31a toward the front surface W1 of the workpiece W. As a result, as illustrated in FIG. 8B, the first solvent F1 adheres onto the front surface W1, the inclined surface W4, and the side surface W3 of the workpiece W. By controlling the number of revolutions of the workpiece W by the rotational driver 22, the first solvent F1 supplied to the front surface W1 of the workpiece W spreads to the front surface W1, the inclined surface W4, and the side surface W3 while spreading toward the outer periphery of the workpiece W. By adjusting the number of revolutions, it is possible to control the spread of the first solvent F1 on the workpiece W.

Figure 8C:
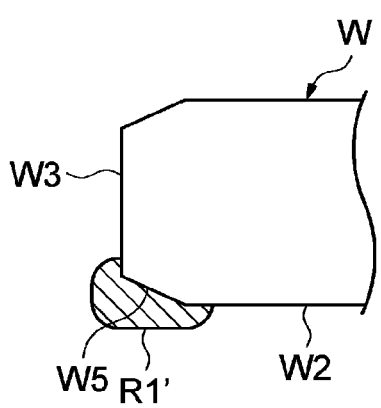

The first chemical liquid R1 consists of a chemical that is removable by the first solvent F1. Therefore, when the solvent is supplied on the top of the first chemical liquid R1, which has adhered to the workpiece W, the first chemical liquid R1 is removed. As a result, as illustrated in FIG. 8C, the first chemical liquid R1 in the region to which the first solvent F1 was supplied is removed, and a partially-removed first chemical liquid R1' remains unremoved. This state is substantially the same as the state illustrated in FIG. 7C. However, when the first chemical liquid R1 is supplied starting from the front surface W1 of the workpiece W, the amount of the partially-removed first chemical liquid R remaining on the side of the rear surface W2 may be reduced compared to the case where the first chemical liquid R1 is supplied starting from the rear surface W2 as illustrated in FIG. 7C, although the amount of the partially-removed first chemical liquid R1' remaining on the side of the rear surface W2 may vary depending on the characteristics of the first chemical liquid R1, such as the viscosity of the first chemical liquid R1.

Figure 8D:
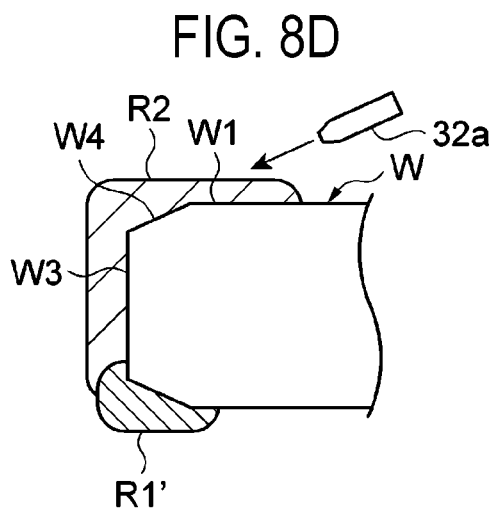

Subsequently, the control device 100 executes step S04. In step S04, in the state in which the workpiece W is rotated by driving the rotational driver 22, the control device 100 controls the second processing liquid supplier 32 to eject the second chemical liquid from the nozzle 32a. As a result, as illustrated in FIG. 8D, the second chemical liquid R2 adheres onto the front surface W1, the inclined surface W4, and the side surface W3 of the workpiece W.

Figure 8E:
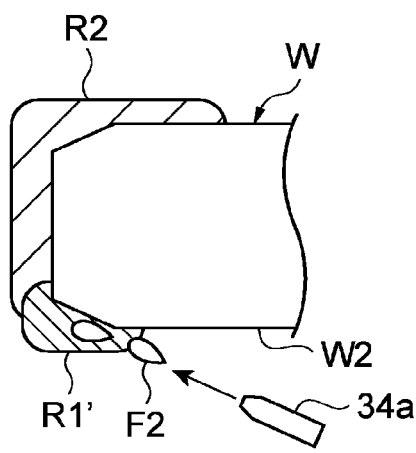
Figure 8F:
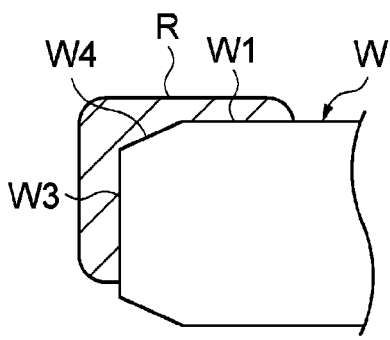

Subsequently, the control device 100 executes step S05. In step S05, in the state in which the workpiece W is rotated by driving the rotational driver 22, the control device 100 controls the fourth processing liquid supplier 34 to eject the second solvent F2 from the nozzle 34a toward the rear surface W2 of the workpiece W. As a result, as illustrated in FIG. 8E, the partially-removed first chemical liquid R1' remaining under the rear surface W2, the inclined surface W5, and the side surface W3 of the workpiece W comes into contact with the second solvent F2, so that the partially-removed first chemical liquid R1', which has adhered to the workpiece W, is removed. As a result, as illustrated in FIG. 8F, the partially-removed first chemical liquid R1' is removed, and the second chemical liquid R2 remains unremoved. The second chemical liquid R2 becomes the coating film R formed on the workpiece W.

By the process described above, the coating film R illustrated in FIG. 5 is formed on the peripheral edge portion of the workpiece W. Although FIG. 6 illustrates only the coating of the processing liquid (a chemical liquid or a solvent) to the workpiece W, a heating process, a drying process, or the like may be performed between respective steps for the purpose of fixing the chemical liquid, promoting the removal process with the solvent, or the like. When performing the heating process, for example, the workpiece W may be moved to the heat treatment unit U2 where the workpiece W is to be subjected to the heat treatment. Such a process is similar to the procedure shown in FIGS. 8A to 8F.

The first chemical liquid R1 may be supplied to the workpiece W starting from the front surface W1 of the workpiece W as in the substrate processing method according to the first modification described with reference to FIGS. 8A to 8F. However, the first chemical liquid R1 is used for the purpose of preventing the coating film R formed by the second chemical liquid R2 from being formed on the rear surface W2 and the inclined surface W5 of the workpiece W. This purpose may be achieved by selectively supplying the first chemical liquid R1 such that the first chemical liquid R1 sufficiently adheres to each region of the rear surface W2 and the inclined surface W5 of the workpiece W where the second chemical liquid R2 may adhere in step S04.

(Second Modification of Substrate Processing Method)

Next, a modification of step S03 in the substrate processing method will be described with reference to FIGS. 9A and 9B. In step S03, a portion of the first chemical liquid R1, which has adhered to the workpiece W, is removed, but such a removal method is not limited to the method of ejecting the first solvent F1 from the nozzle 31a described above.

Figure 9A:
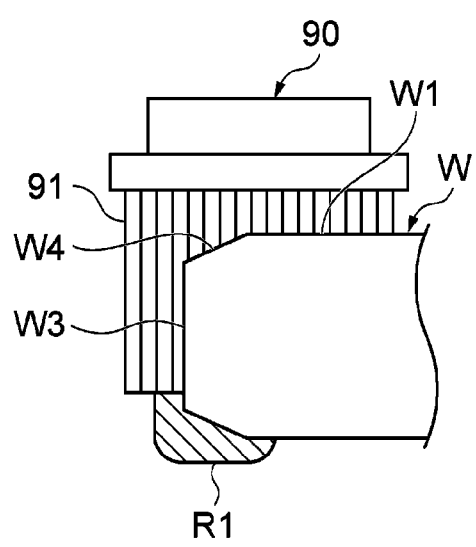
FIGS. 9A and 9B are schematic views for explaining a modification of the substrate processing method.

FIG. 9A illustrates an example in which a portion of the first chemical liquid is removed using a brush 90 having a bristle material 91 (a removing member) capable of coming into contact with the front surface W1, the inclined surface W4, and the side surface W3 of the workpiece W to which the first chemical liquid R1 has adhered. By bringing the brush 90 into contact with the workpiece W, it is possible to make the first chemical liquid R1 remaining under the workpiece W while removing the first chemical liquid R1, which has adhered to the front surface W1, the inclined surface W4, and the side surface W3 of the workpiece W. The bristle material 91 may be configured to have a shape corresponding to the shape of the peripheral edge portion of the workpiece W so that the workpiece W can be prevented from being damaged by the bristle material 91. By configuring the brush 90 to be movable in the horizontal direction and the vertical direction by, for example, a movement mechanism (not illustrated), the brush 90 may be configured to stand outside the cup 26 when the brush 90 is not used. In addition, although FIG. 9A illustrates the brush 90 provided with the bristle material 91, the removing member for removing the first chemical liquid R1 is not limited to the bristle material 91. For example, a sponge or the like may be used as the removing member.

Figure 9B:
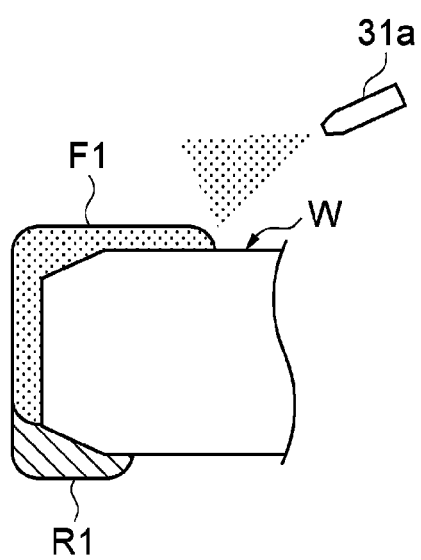

FIG. 9B illustrates a state in which the first solvent F1 is sprayed from the nozzle 31a in an atomized state (in the form of mist) when the first solvent F1 is ejected from the nozzle 31a of the first processing liquid supplier 31. The method of ejecting the first solvent F1 may be changed in the above manner. When the first solvent F1 is sprayed in an atomized state, the first chemical liquid R1 and the first solvent F1 are likely to come into contact with each other. Thus, the movement (removal) of the first chemical liquid R1 can be promoted by the first solvent F1. Therefore, in a case of controlling the range in which the first chemical liquid R1 is removed using the movement of the first solvent F1, it is possible to perform the control with high accuracy.

[Action]

According to the aforementioned substrate processing apparatus (the coating/developing apparatus 2) and the aforementioned substrate processing method, after the first chemical liquid R1 is supplied to the peripheral edge of the workpiece W including the rear surface W2 of the workpiece W, the first chemical liquid R1, which has adhered to at least a portion of the front surface W1 and the side surface W3 of the workpiece W, is removed. Then, after the second chemical liquid R2 is supplied to the front surface W1 and the side surface of the workpiece W, the first chemical liquid R1 remaining on the workpiece W (the partially-removed first chemical liquid R1') is removed by the second solvent F2. In this way, when the second chemical liquid R2 for forming the coating film R is supplied, the rear surface of the workpiece W is in the state in which the first chemical liquid R1 has adhered thereto. Thus, since the second chemical liquid R2 is prevented from adhering to the rear surface of the workpiece W, it is possible to form the coating film R on the front surface W1 and the side surface of the workpiece W. Therefore, it is possible to form the coating film on the peripheral edge portion including the peripheral edge of the front surface W1 and the side surface of the workpiece W while preventing the coating film from being formed on the rear surface of the workpiece W.

Conventionally, it has been reviewed to prevent damage to the peripheral edge or the like in various processing processes such as etching of a workpiece W by forming a coating film using a resist liquid or the like on the peripheral edge of the front surface W1 of the workpiece W. In this regard, since the side surface W3, the inclined surface W4 between the front surface W1 and the side surface W3, and the like of the workpiece W may be damaged in the subsequent processing process, protecting the workpiece W by forming a coating film on the inclined surface W4 and the side surface W3 as well has been under consideration. However, when the processing liquid for forming the coating film is supplied to the side surface W3 or the like of the workpiece W using the method of forming a coating film on the peripheral edge of the front surface W1 of a workpiece W, the processing liquid may also flow around the rear surface W2 of the workpiece W. When the processing liquid flows around to the rear surface W2, the processing liquid may affect the transfer of the workpiece W in the subsequent stage. Therefore, it is required to control the supply of the processing liquid such that the coating film is not formed on the inclined surface W5 and the rear surface W2 positioned lower than the side surface W3 of the workpiece W.

In contrast, according to the method described above, the first chemical liquid R1 is supplied to the rear surface W2 of the workpiece W before the coating of the second chemical liquid R2. Therefore, when the second chemical liquid R2 is supplied, the rear surface W2 of the workpiece W is protected by the first chemical liquid R1. Therefore, the second chemical liquid R2 is prevented from adhering to the rear surface W2 of the workpiece W, and the formation of the coating film R is also prevented. In addition, the first chemical liquid R1, which has adhered to the side surface W3 or the like, is removed before the supply of the second chemical liquid R2 by, for example, the supply of the first solvent F1 from the first processing liquid supplier 31. Therefore, since the second chemical liquid R2 is supplied to the side surface W3 of the workpiece W after the first chemical liquid R1 is removed, the coating film is appropriately formed by the second chemical liquid R2. Therefore, it is possible to appropriately form the coating film R on the peripheral edge of the front surface W1 and the side surface W3 while preventing the coating film R from being formed on the rear surface W2 of the workpiece W.

In addition, in the apparatus described above, the third processing liquid supplier 33 (the first chemical liquid supplier) configured to supply the first chemical liquid R1 includes the nozzle 33a (the first nozzle) provided close to the rear surface W of the workpiece W so as to eject the first chemical liquid R1 to the peripheral edge of the workpiece W. In addition, the second processing liquid supplier 32 (the second chemical liquid supplier) configured to supply the second chemical liquid R2 includes the nozzle 32a (the second nozzle) provided close to the front surface W1 of the workpiece W so as to eject the second chemical liquid R2 to the front surface W1 of the workpiece W and the side surface of the workpiece W. With such a configuration, it is possible to cause the first chemical liquid R1 to appropriately adhere to the peripheral edge of the workpiece W including the rear surface W2. Therefore, it is possible to form the coating film R on the peripheral edge portion including the peripheral edge of the front surface W1 and the side surface W3 of the workpiece W while preventing the second chemical liquid R2 from adhering to the rear surface W2 of the workpiece W by the first chemical liquid R1.

In addition, as described above in the first modification illustrated in FIGS. 8A to 8F, the first chemical liquid supplier configured to supply the first chemical liquid R1 may include the nozzle 35a (the first nozzle) provided close to the front surface W1 of the workpiece W so as to eject the first chemical liquid R1 to the peripheral edge of the workpiece W. In the case in which the nozzle 35a is provided close to the front surface W1 of the workpiece W, it is possible to prevent arranging a mechanism for supplying the first chemical liquid in the vicinity of the rear surface of the workpiece W from becoming complicated.

In addition, in the coating/developing apparatus 2, the first processing liquid supplier 31 serving as a partial removing part includes the nozzle 31a (the third nozzle) provided close to the front surface W1 of the workpiece W so as to eject the first solvent F1 capable of removing the first chemical liquid R1. Further, the control device 100 controls each part so as to eject the solvent to the workpiece W in the state in which the workpiece W is rotated. With the above-described configuration, it is possible to appropriately remove the first chemical liquid R1, which has adhered to at least a portion of the front surface W1 and the side surface of the workpiece W, using the first solvent F1. Therefore, it is possible to enable the second chemical liquid R2 for forming the coating film R to appropriately adhere to the front surface W1 and the side surface of the workpiece W.

In addition, the control device 100 controls each part to supply the second chemical liquid R2 in the state in which the workpiece W is rotated. At this time, the number of revolutions of the workpiece W when supplying the second chemical liquid R2 from the second processing liquid supplier 32 serving as a second chemical liquid supplier may be smaller than the number of revolutions of the workpiece W when supplying the first solvent F1 from the first processing liquid supplier 31 serving as a partial removing part. As described above, by increasing the number of revolutions of the workpiece W when supplying the first solvent F1, it is possible to prevent the first solvent F1 from moving toward the rear surface W2 of the workpiece W. In addition, by reducing the number of revolutions of the workpiece W when supplying the second chemical liquid R2, it is possible to evenly supply the second chemical liquid R2 to the workpiece W. Furthermore, since it is possible to prevent the liquid from splashing on the workpiece W when supplying the second chemical liquid R2, it is possible to prevent the second chemical liquid R2 from scattering.

As described above, the nozzle 31a configured to supply the first solvent F1 may spray the first solvent F1 onto the workpiece W in an atomized state. In this case, it is possible to supply the solvent to a desired position on the workpiece W, and the first chemical liquid R1 is appropriately removed by the first solvent F1.

Alternatively, the first chemical liquid R1 may be removed using the bristle material 91 of the brush 90 as a partial removing part instead of the first processing liquid supplier 31 configured to supply the first solvent F1. That is, the first chemical liquid R1 may be removed by bringing the bristle material 91 of the brush 90 serving as a removing member into contact with the front surface W1 and the side surface W3 of the workpiece W in the state in which the workpiece W is rotated while holding the workpiece W by the spin chuck 21 serving as a substrate holder. As described above, with the configuration in which the first chemical liquid R1 is removed by bringing the removing member into contact with the first chemical liquid R1 on the front surface W1 and the side surface W3 of the workpiece W, it is possible to appropriately remove the first chemical liquid R1 at a desired position.

Although various exemplary embodiments have been described above, the present disclosure is not limited to the exemplary embodiments described above, and various omissions, substitutions, and changes may be made. In addition, elements in different embodiments may be combined to form other embodiments.

For example, the arrangement of each part in the substrate processing apparatus (the coating/developing apparatus 2) is an example and may be appropriately changed. For example, the configuration of supplying a processing liquid (chemical liquid or solvent) to the workpiece W may be appropriately changed. In addition, the arrangement of the nozzles 31a to 35a configured to supply processing liquids, the arrangement of the processing liquid sources 31b to 34b, the arrangement of the pipes 31c to 34c, and the like may be appropriately changed. Furthermore, the configuration of each part of the coating unit U1 including the spin chuck 21 (the substrate holder), the rotational driver 22, the guide ring 25, the cup 26, and the like may be also appropriately changed.

In the above-described exemplary embodiments, the coating unit U1 of the processing module 12 which performs the substrate processing has been described as a unit for forming the coating film R on the peripheral edge portion of the workpiece W, but the same function may be provided to another unit of another module.

According to the present disclosure, a technique capable of forming a coating film on the peripheral edge of a front surface of a substrate and a side surface of the substrate is provided.

From the foregoing, it should be understood that various embodiments of the present disclosure have been described herein for purposes of illustration, and that various modifications can be made without departing from the scope and spirit of the present disclosure. Accordingly, the various embodiments disclosed herein are not intended to be limiting, and the true scope and spirit of the disclosure is indicated by the appended claims.

What is claimed is:

1. A substrate processing method of forming a coating film on a peripheral edge portion including a first peripheral edge of a front surface of a substrate and a side surface of the substrate, the substrate processing method comprising:
- supplying a first chemical liquid onto the peripheral edge portion of the substrate including a rear surface of the substrate;
- removing, among the first chemical liquid supplied onto the substrate, a portion of the first chemical liquid adhering to the front surface and the side surface of the substrate by supplying a first solvent onto the first peripheral edge, after the supplying a first chemical liquid;
- supplying a second chemical liquid for forming the coating film on the front surface and the side surface of the substrate, after the removing a portion of the first chemical liquid; and
- removing the first chemical liquid remaining on the substrate to which the second chemical liquid adheres by supplying a second solvent onto a second peripheral edge of the rear surface of the substrate, after the supplying a second chemical liquid.

2. The substrate processing method of claim 1, wherein, in the supplying a first chemical liquid, the first chemical liquid is supplied from a portion below the rear surface of the substrate to the peripheral edge portion of the substrate, and
- wherein, in the supplying a second chemical liquid, the second chemical liquid is supplied from a portion above the front surface of the substrate to the front surface and the side surface of the substrate.

3. The substrate processing method of claim 1, wherein, in the supplying a first chemical liquid, the first chemical liquid is supplied from a portion above the front surface of the substrate to the peripheral edge portion of the substrate, and
- wherein, in the supplying a second chemical liquid, the second chemical liquid is supplied from a portion above the front surface of the substrate to the front surface and the side surface of the substrate.

4. The substrate processing method of claim 1, wherein, in the removing a portion of the first chemical liquid adhering to the front surface and the side surface of the substrate, the first solvent capable of removing the first chemical liquid is ejected from a portion above the front surface of the substrate onto the substrate in a state in which the substrate is rotated.

5. The substrate processing method of claim 4, wherein, in the supplying a second chemical liquid, the second chemical liquid is supplied in the state in which the substrate is rotated, and
- wherein a first number of revolutions of the substrate when supplying the second chemical liquid is smaller than a second number of revolutions of the substrate when ejecting the first solvent.

6. The substrate processing method of claim 4, wherein, in the removing a portion of the first chemical liquid adhering to the front surface and the side surface of the substrate, the first solvent is sprayed onto the substrate in an atomized state.

7. The substrate processing method of claim 1, wherein, in the removing a portion of the first chemical liquid adhering to the front surface and the side surface of the substrate, a remover capable of removing the first chemical liquid comes into contact with the front surface and the side surface of the substrate in a state in which the substrate is rotated.

* * * * *